(12) United States Patent
Galatenko et al.

(10) Patent No.: US 7,257,791 B2
(45) Date of Patent: Aug. 14, 2007

(54) MULTIPLE BUFFER INSERTION IN GLOBAL ROUTING

(75) Inventors: Alexei V. Galatenko, Moscow (RU); Elyar E. Gasanov, Moscow (RU); Andrej A. Zolotykh, Moskovskaya Oblast (RU); Iliya V. Lyalin, Moscow (RU)

(73) Assignee: LSI Corporation, Milpitas, CA (US)

( * ) Notice: Subject to any disclaimer, the term of this patent is extended or adjusted under 35 U.S.C. 154(b) by 247 days.

(21) Appl. No.: 10/992,999

(22) Filed: Nov. 19, 2004

(65) Prior Publication Data

US 2006/0112363 A1    May 25, 2006

(51) Int. Cl.
*G06F 17/50* (2006.01)
(52) U.S. Cl. ............................................ 716/10; 716/12
(58) Field of Classification Search ............... 716/8–12
See application file for complete search history.

(56) References Cited

U.S. PATENT DOCUMENTS

| | | | |
|---|---|---|---|
| 6,311,313 B1 * | 10/2001 | Camporese et al. ........... 716/6 |
| 6,564,361 B1 | 5/2003 | Zolotykh et al. ............... 716/8 |
| 6,681,373 B1 | 1/2004 | Zolotykh et al. ............... 716/2 |
| 6,698,006 B1 * | 2/2004 | Srinivasan et al. ........... 716/10 |
| 6,754,877 B1 * | 6/2004 | Srinivasan ..................... 716/2 |
| 7,020,589 B1 * | 3/2006 | Datta Ray et al. .............. 703/2 |
| 7,036,103 B2 * | 4/2006 | Miller et al. ................... 716/9 |

* cited by examiner

*Primary Examiner*—Jack Chiang
*Assistant Examiner*—Binh Tat
(74) *Attorney, Agent, or Firm*—Westman, Champlin, & Kelly

(57) ABSTRACT

Buffers are inserted into an integrated circuit chip design using a table that identifies buffer types based on buffer height, input capacitance, output capacitance and ramptime. A buffer routing tree is created having root, internal and leaf vertices. For each internal vertex, the initial circuit parameters are compared to circuit parameters associated with buffers identified in the table to identify whether a buffer identified in the table can be inserted to the respective internal vertex. If it can, an optimal insertable buffer is selected from the table and inserted to a selected internal vertex based at least in part on the comparison results. Also described is a computer process of creating the buffer type table.

20 Claims, 4 Drawing Sheets

US 7,257,791 B2

MULTIPLE BUFFER INSERTION IN GLOBAL ROUTING

FIELD OF THE INVENTION

The present invention is directed to designing integrated circuit (IC) chips, and particularly to a process and computer readable program for optimal insertion of multiple buffers into an IC chip design.

BACKGROUND OF THE INVENTION

An integrated circuit chip (hereafter referred to as an "IC" or a "chip") comprises cells and connections between cells formed on a surface of a semiconductor substrate. The IC may include a large number of cells and require complex connections between the cells.

A cell is a group of one or more circuit components such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins that must be connected. Because a typical chip has numerous pins, often hundreds of thousands or more that must be connected in various combinations, there may be hundreds of thousands of nets defining the chip. Most nets define only two pins to be connected, but some nets require three or more pins, some require hundreds of pins.

A netlist is a list of nets for a chip. The netlist is useful during the design phase of the chip to identify probable performance of the chip, including its parameters such as capacitance, timing and component size.

Due to the large number of components and the details required during the fabrication process, the design of an IC is not practical without the aid of computers. As a result, most phases of chip design extensively use Computer Aided Design (CAD) tools, and many phases have already been partially or fully automated. Automation of the physical design process has increased the level of integration, reduced turn around time and enhanced chip performance.

Routing is performed to complete interconnections between groups of cells of the chip according to the specified netlist. Routing is usually done in two phases referred to as the global routing and detailed routing phases. In global routing, connections are completed between blocks of the circuit disregarding the exact geometric details of each wire and terminal. For each wire, a global router finds a list of channels that are to be used as a passageway for that wire.

Global routing is followed by detailed routing, which completes point-to-point connections between terminals on the blocks, specifying geometric information of the wires such as wire width and layer assignments.

In order for circuit designers to calculate the performance of the IC under design, the designers need to compute the delays of the cells in the IC. These delays may be in the form of propagation delay, which is the time duration a signal takes to travel from the input to the output of a cell, and the ramptime, which is the time duration that a data signal is required to be stable following its input to a cell.

To assure that signals arrive at the correct time, designers often design buffers, such as inverters, into the wire paths to perform signal delays. While placement of buffers is desirable during the global routing phase, the task is made difficult due to the varying sizes, capacitances and ramptimes of buffers. The present invention is directed to placement of buffers, including inverters, in channels during the routing stage of design for optimal performance in the IC.

SUMMARY OF THE INVENTION

In one embodiment of the invention a table is provided that identifies optimal buffers based on a plurality of circuit parameters, such as buffer height, input pin capacitance, output capacitance and ramptime. A buffer routing tree is created having root, internal and leaf vertices. For each internal vertex, the initial circuit parameters are compared to circuit parameters associated with buffers identified in the table to identify whether a buffer identified in the table can be inserted to a segment of the tree associated with the respective internal vertex. An optimal buffer from the table is inserted to a selected internal vertex based at least in part on the comparison results.

In some forms of this embodiment of the invention, the circuit parameters of the IC are recomputed based on insertion of the selected buffer. If the recomputed circuit parameters represent an improvement of circuit performance over the initial circuit performance, the selected buffer is inserted into the design.

In some forms of this embodiment selection of possible buffers for insertion at a given internal vertex is based on an improved delay parameter of the chip design by the selected buffer.

Another embodiment of the invention is a process of creating a table of optimal buffer types useful for designing integrated circuit chips containing buffers. A plurality of intervals of a buffer output capacitance range is identified for buffers having a selected height and selected input pin capacitance. For each buffer height and each output capacitance interval, each buffer is identified having the selected height and input pin capacitance. A plurality of buffer ramptime intervals is identified for a range of buffer ramptimes represented by the identified buffers. An optimal buffer type is identified for each buffer ramptime interval, creating the table of buffer types based on buffer height, input capacitance, output capacitance and ramptime.

Another embodiment of the invention is a computer readable program, embodied in a computer readable medium containing code that causes a computer to carry out the processes of creating a table of buffer types and inserting optimal buffers into IC designs.

DETAILED DESCRIPTION OF THE PREFERRED EMBODIMENTS

Figure 1:
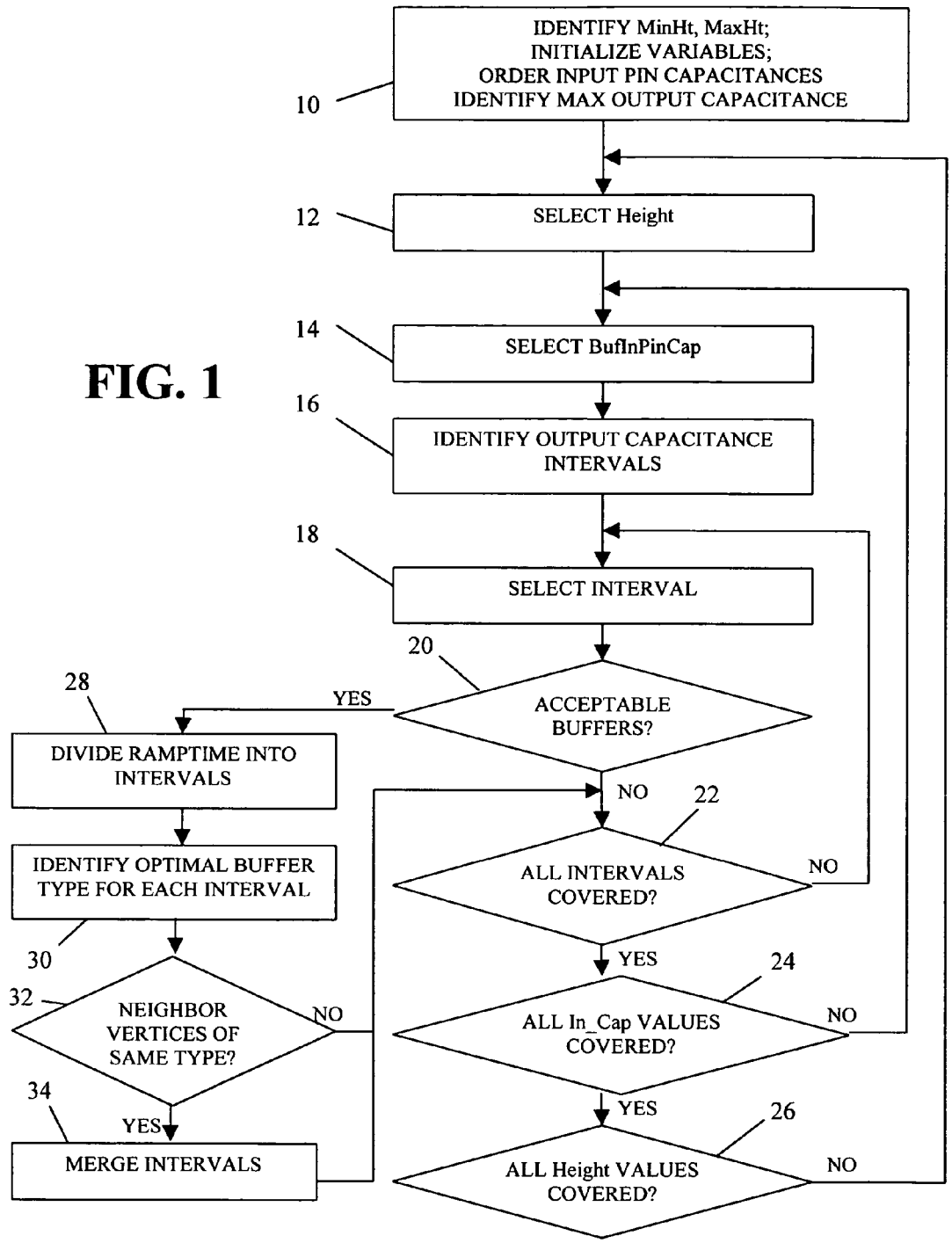
FIG. 1 is a flowchart of a process for creating a table used for optimal buffer selection in the present invention.

FIG. 1 is a flowchart illustrating a process of creating an optimal buffer selection table. The purpose of the process of FIG. 1 is to create a table of optimal buffer types for various conditions that can arise during buffer resynthesis. Buffer size and design optimization parameters are considered in creating the table. Buffer size is considered because the buffer to be inserted should fit into free space available on the layout. The design optimization parameters include buffer capacitance and ramptime.

The buffer selection table is a four-dimensional table of buffer types. The dimensions are height (which is the length of the buffer along a channel), input pin capacitance, output capacitance, and ramptime.

As shown in FIG. 1, at step 10 the minimal and maximal possible heights of buffers for all possible values of input pin capacitances are identified as MinBufHt and MaxBufHt, respectively. Variables MinBufHt_Table, MaxBufHt_Table and MinBufInPinCap are initialized to the requirements of the IC under design. MinBufHt_Table is the minimum buffer height for the IC, MaxBufHt_Table is the maximum buffer height for the IC and MinBufInPinCap is the minimum input pin capacitance for any buffer of the IC chip. An ordered array of all possible input pin capacitances BufInPinCap is created and a maximal output capacitance, MaxCap, is identified.

At step 12, a buffer height, Height, is selected between the minimum and maximum buffer heights in the table, MinBufHt_Table≦Height≦MaxBufHt_Table. A possible input pin capacitance, BufInPinCap, is selected at step 14 for the selected buffer height.

At step 16, the range of possible output capacitance values for the selected buffer height and selected input pin capacitance is divided (segmented) into intervals; the range of capacitance values of each interval is equal to some fixed parameter. The beginning of a given interval N+1 is the end of the prior interval N. The beginning of the first interval is 0, and the end of the last interval is greater than or equal to MaxCap.

The intervals are arranged in an output capacitance array, OutCapBoundLens. The index of each element in the Out-CapBoundLens array is the intersection of (1) the height of the buffer under consideration less the minimum buffer height for the table (Height−MinBufHt_Table) and (2) the number of input pin capacitance values (InCap_Num) in the buffer input pin capacitance (BufInPinCap) array. Thus, the index of each element in the OutCapBoundLens array is [Height−MinBufHt_Table],[InCap_Num]. The end points of each interval are arranged in an ordered output capacitance bounds array, OutCapBounds, with each element in the array having an index [Height−MinBufHt_Table], [InCap_Num].

At step 18 an output capacitance interval is selected, and at step 20 all acceptable buffer types for the selected interval are identified. An acceptable buffer type is one whose height is not greater than Height, whose input pin capacitance is not greater than InCap and whose output pin capacitance is not smaller than OutCap. Thus, a buffer type is acceptable if the following conditions are satisfied:
buffer height≦Height,
buffer input pin capacitance≦InCap, and
buffer output pin capacitance≧OutCap.

If at step 20 there are no acceptable buffer types, empty values (such as "0") are assigned to three buffer table arrays: RampBoundLens, RampBounds and BufTypeTable, with each array being defined by elements [Height−MinBufHt_Table], [InCap_Num] and [OutCap_Num]. As will be more fully described below, the RampBoundLens and Ramp-Bounds arrays will be used to define ramptimes, and the BufTypeTable array is the main table identifying the buffer types for selection of the optimal buffers.

If there are no acceptable buffer types at step 20, the process proceeds to the next set of values. More particularly, at step 22 if all intervals have not yet been processed, the process loops back to step 18 to select the next interval value. If all interval values have been processed, the process proceeds to step 24. If at step 24 all input capacitance (InCap) values have not been processed, the process loops back to step 14 to select the next InCap value. If at step 24 all InCap values have been processed, the process proceeds to step 26. If at step 26 all Height values have not been processed, the process loops back to step 12 to select the next Height value. Thus, the process continues until all variables, interval values, InCap values and Height values have been processed. At this point, the process has considered every possible combination in terms of space and input and output capacitances.

If at step 20, there was an acceptable buffer, the process then needs to consider ramptime. At this point in the process, the process has selected three of the four dimensions of the table, namely height (the length of the buffer along a channel), input pin capacitance and output capacitance.

At step 28, the range of ramptime values domain is divided into intervals of given size (where the minimal and maximal possible ramptime values and interval size are algorithm parameters). At step 30, an optimal acceptable buffer type is identified for each ramptime interval and is inserted into the BufTypeTable at the [Height−MinBufHt_Table], [InCap_Num],[OutCap_Num] position.

The optimal buffer type is the one that gives the optimal delay. It is preferred that the ramptime intervals be small enough for correct optimal type selection. If at step 32, two neighboring intervals have the same optimal buffer type, the intervals are united (merged) at step 34. The process then loops back to step 22 to loop through steps 12-18 until all parameters are examined and an optimal buffer type is found for each interval.

The process of FIG. 1 creates a table with three arrays: RampBounds and RampBoundLens, which define intervals for the ramptime range, and BufTypeTable, which is the main array that contains optimal buffer types.

After all possible sets of values are processed, construction of the Buffer Selection Table is finished. Construction of the table is performed only once during the initialization phase. Thereafter, table can be used during timing optimization phase.

Figure 3:
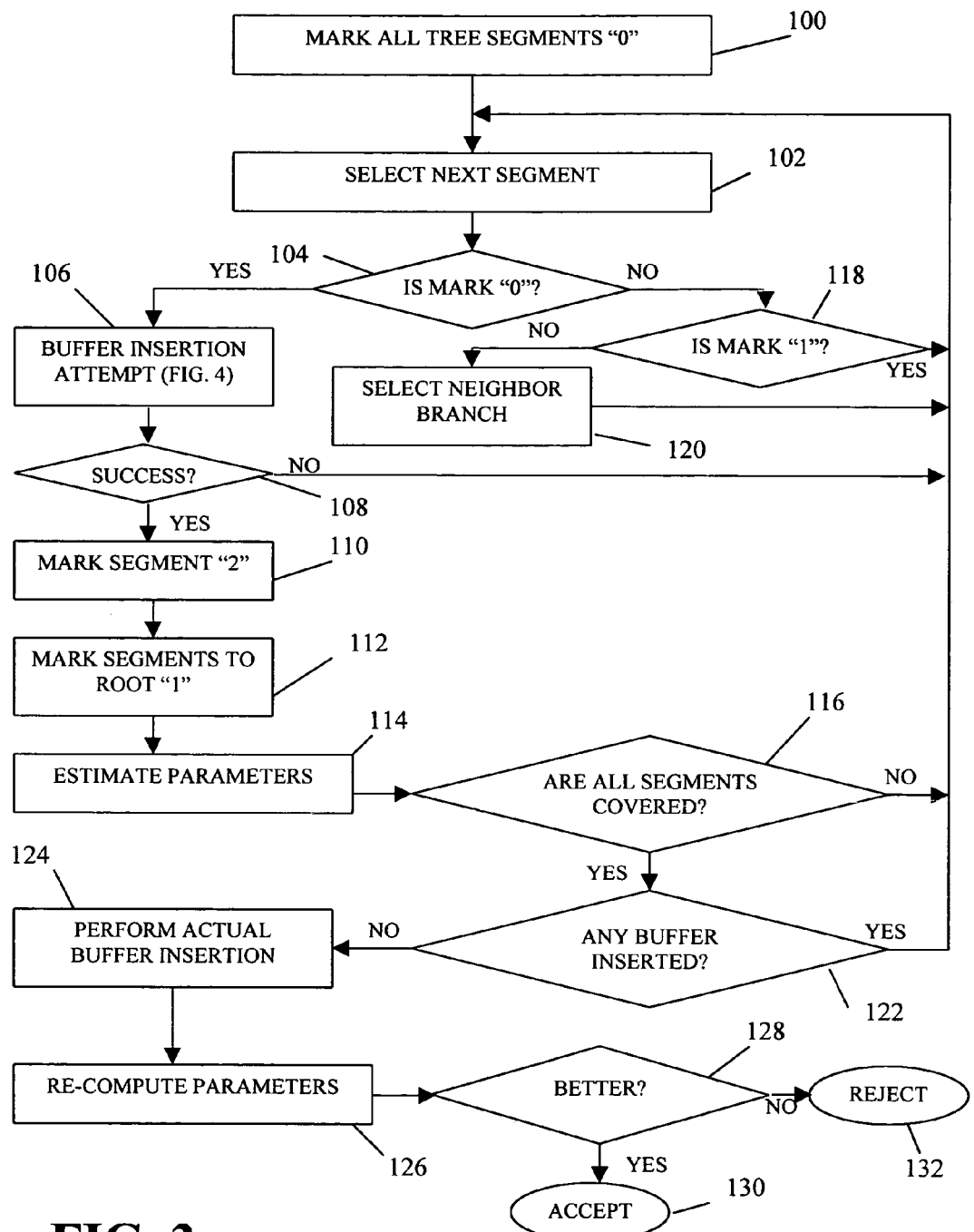
FIG. 3 is a flowchart of a process of buffer insertion in accordance with an embodiment of the present invention.

The next part of the process is the actual buffer insertion, which is performed by the process shown in FIG. 3.

Figure 2:
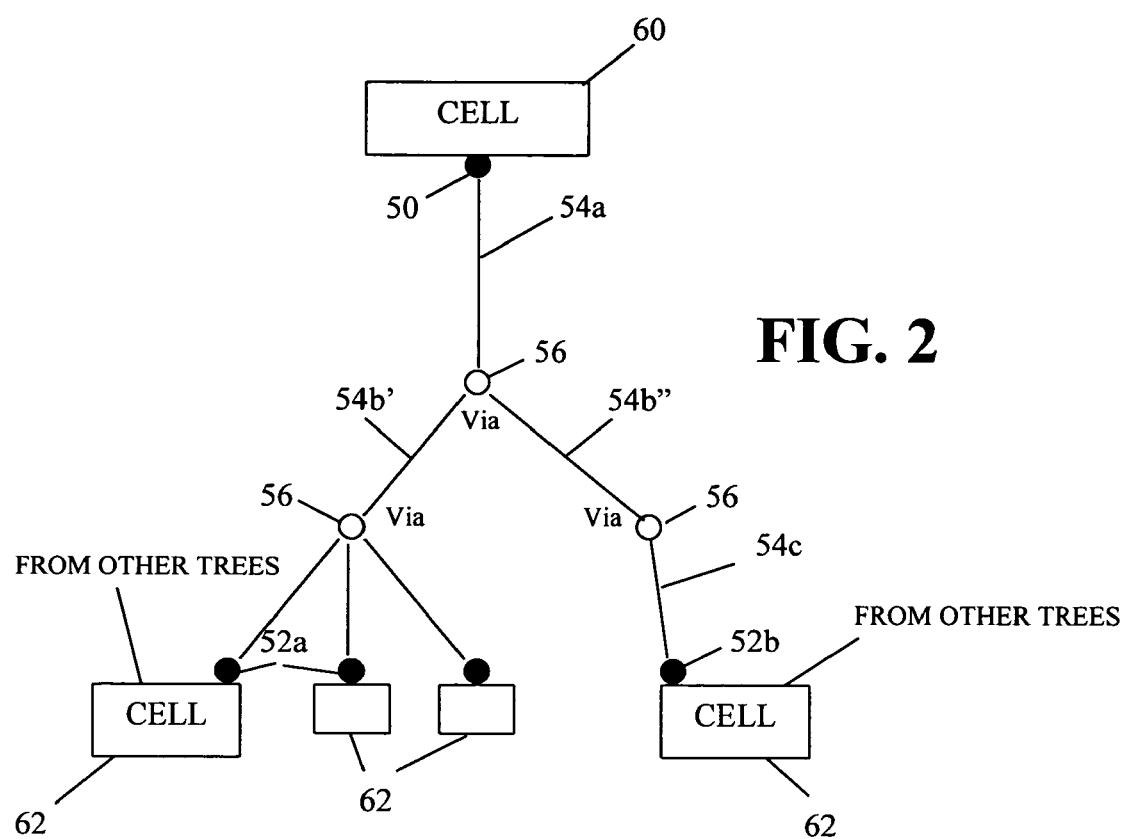
FIG. 2 is an illustration of a portion of a routing tree useful to explain a portion of the present invention.

Consider a routing tree shown in FIG. 2 having a root vertex represented by one output pin 50 of a logic cell, one or more leaf vertices represented by input pins 52 of one or more logic cells, one or more internal vertices 56, called vias, and one or more segments 54 connecting parent and child vertices where buffers might be inserted. For each routing tree, each leaf vertex 52 and each internal vertex 56 has one parent, and the root vertex 50 and each internal vertex 56 has one or more children. An incoming signal is applied to the root vertex, such as from an output pin 50 of a transmitting logic cell 60. The signal is propagated through the circuit represented by the tree and is buffered by buffers and/or inverters in segments 54, to supply buffered signals to the input pins 52 of receiving cells 62. Routing trees are more fully described in U.S. Pat. No. 6,681,373 granted Jan. 10, 2004 to Andrej A. Zolotykh, Elyar E. Gasanov, Alexander S. Podkolzin and Valery B. Kudryavtsev for "Method and Apparatus for Dynamic Buffer and Inverter Tree Optimization," the content of which is hereby incorporated by reference in its entirety.

At step 100 of the process shown in the flowchart of FIG. 3, all tree segments 54 are initially marked with "0". At step 102, a segment is selected. The segments are selected in the order of the routing tree of FIG. 2, starting with the root of the tree and continuing to the leaves of the tree.

At step 104, if the segment is marked "0", the process continues to step 106 where a buffer insertion attempt is performed. The process of buffer insertion attempt is more fully described in connection with the flowchart of FIG. 4.

If at decision step 108 the buffer insertion attempt was not successful, the process loops back to step 102 and selects the next segment, which will ordinarily be a child of the previous segment. If the buffer insertion attempt was successful, the process continues to step 110 to mark the segment with a "2" and at step 112 to mark the parent segments to the root with "1". Thus, if a segment 54c to pin 52b is marked "2", parent segments 54a and 54b" (right side) are marked "1". Segments in the other branch(es) are unaffected by the marking, so in this example, segments 54b' (left side) and its child vertices remain to be examined. Moreover, upon marking a segment with a "2", the process is ended as to that segment's child vertices. For example, if segment 54b" is marked "2", its child vertices are not processed.

At step 114, the information concerning the accepted insertion is saved and the variables associated with net parameters (driver capacitance, delay) and overall delay are recomputed and saved. At step 114, the net parameters and delay need only be estimated, so this step can be quite rapid. These parameters will be more accurately calculated at step 126 after insertion of the buffers.

At decision step 116, if all segments have not been processed, then the process loops back to step 102 to select the next segment.

If at step 104 the segment under consideration is marked with "1", decision step 118 loops the process back to step 102 to proceed to the next segment. If segment is marked with "2", then at step 120, the process stops going from this segment down to child segments, and proceeds to segments of this level, i.e., in a neighboring branch, or (if there are no neighbor branches) to higher levels. For example, if segment 54b' in FIG. 2 were marked "2", at step 120 the process would advance to segment 54b", assuming it is not marked.

After processing the entire tree, as identified at decision step 116, the process of actual buffer insertion begins at step 122. If there were acceptable insertions, and presuming they have not yet been inserted, all buffer insertions are performed at step 124. Buffer insertion is preferably performed by identifying an edge of the respective segment, splitting the segment, and inserting the buffer to split point. Thereafter, the parameters (such as delay) are accurately calculated at step 126.

Calculation of the parameters at step 126 is a slower process than the approximate computation performed at step 114 but is only calculated once since now buffer insertion is near final. If at decision step 128 the corrected parameters for the IC are better than the estimated parameters were before insertions, the buffer insertions are accepted at step 130. Otherwise, the process returns to the to the initial tree at step 132.

A process of identifying whether the parameters are improved is more fully described in U.S. Pat. No. 6,564,361 granted May 13, 2003 to Andrej A. Zolotykh, Elyar E. Gasanov, Alexander S. Podkolzin and Valery B. Kudryavtsev for "Method and Apparatus for Timing Driven Resynthesis," the content of which is hereby incorporated by reference in its entirety.

Figure 4:
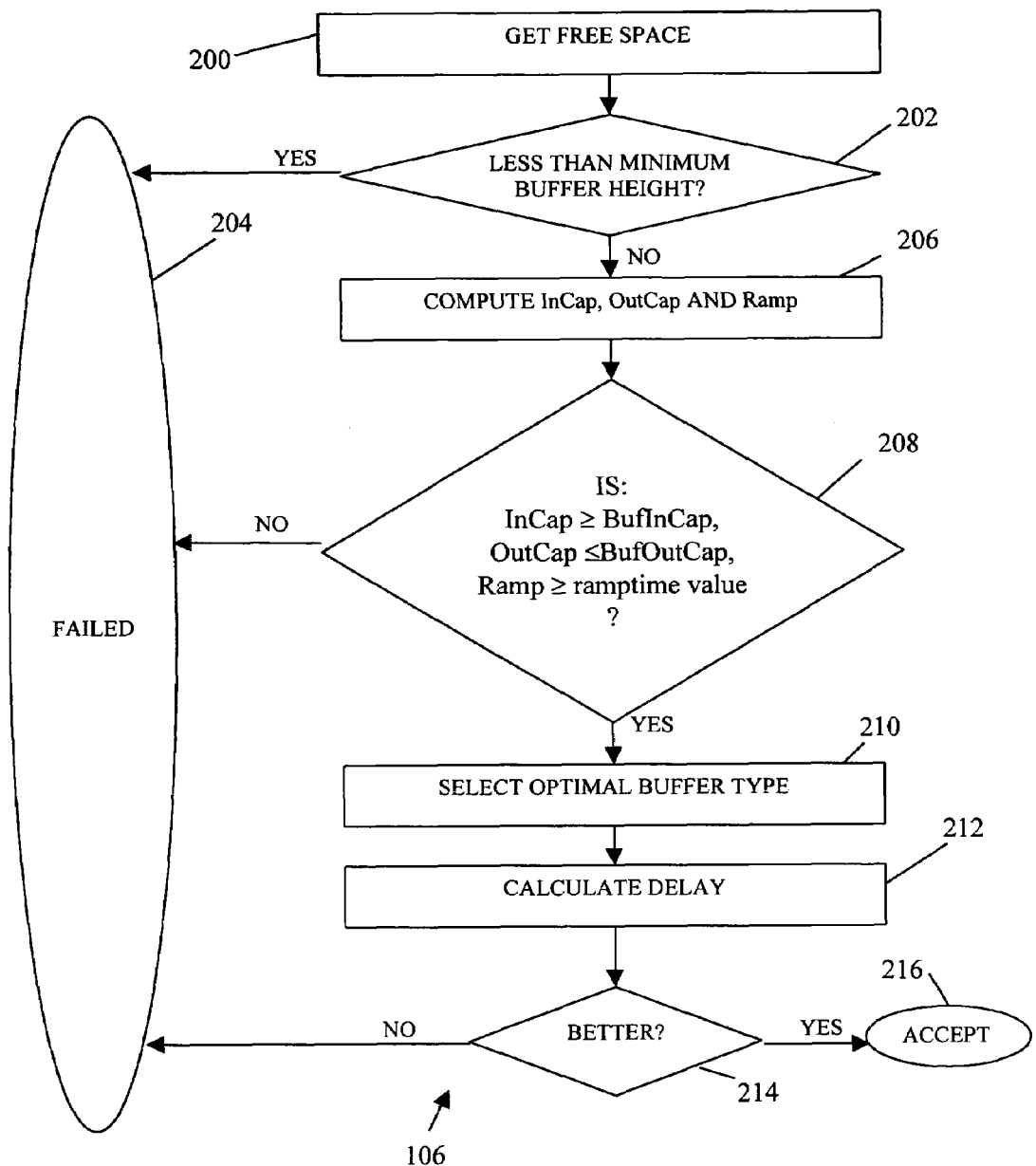
FIG. 4 is a flowchart of a buffer insertion sub-process used in the process illustrated in FIG. 3.

The process of step 106 in FIG. 3 is more fully described in the flowchart of FIG. 4. At step 200, free space for the buffer is identified. If at decision step 202 there is no place to insert a buffer, namely if the free space height (length along the channel) is less than MinBufHt_Table, the insertion fails and the process is ended at 204.

If there is sufficient free space for a buffer as determined at step 204, the input and output capacitances InCap and OutCap and ramptime Ramp are computed at step 206. The input capacitance InCap is the sum of tree segment (wire) capacitances and input pin capacitances. The value of InCap is stored in the routing tree, and is taken from the appropriate subtree, defined by a buffer that is attempted to be inserted. Output capacitance OutCap is equal to InCap minus a constant E. In most cases, E is small compared to the value of InCap. Ramptime Ramp is a function of the length of the segment between InCap and OutCap and of the cell type, and thus a function of the distance between the buffer being inserted and the parent (upper) vertex of the routing tree. Both parameters can be evaluated quite rapidly.

Next, a search of the Buffer Selection Table that was created using the process of FIG. 1 is made for the optimal buffer type. This step is done in conjunction with decision step 208. More particularly, the insertion attempt fails to step 204 if InCap is less than all possible buffer input capacitances, meaning that none of the buffers is suitable for such input capacitance. If InCap is not smaller than all possible buffer input capacitances, a maximal buffer input capacitance is selected that is less than or equal to InCap. If at step 208 OutCap is greater than all possible buffer output capacitances, meaning that none of the buffers is suitable for the output capacitance, the insertion fails to 204. Otherwise a minimal buffer output capacitance (defined by an output capacitance interval border) is selected that is greater than or equal to Outcap. If Ramp is less than all possible ramptime values, meaning that none of the buffers is suitable for the ramptime, the insertion fails to 204. Otherwise a maximal ramptime is selected from the table (defined by a ramptime interval border) that is less than or equal to Ramp. The selected parameters define a unique buffer type determined to be optimal for this set. That buffer is selected from the Optimal Buffer Table at step 210.

At step 212, the change of overall delay is estimated, that is, calculated by approximation. If at decision step 214 the change of overall delay is reduced, the insertion is accepted at 216, otherwise the insertion fails at 204. Acceptance of the insertion attempt at step 216 is identified at step 108 in FIG. 3 to advance the insertion process to step 110 in FIG. 3. Failure of the insertion attempt at step 204 is identified at step 108 in FIG. 3 to return the insertion process to step 102 in FIG. 3.

As previously described, the approximation of parameters is employed in the selection and placement of buffers as described in connection with FIG. 3. The parameters are later more accurately calculated at step 126 in FIG. 3.

In preferred embodiments, memory allocated for BufTypeTable and associated arrays may be cleared after completion of the process.

The present invention thus provides an innovative approach to various design parameters improvements in buffer trees. The invention employs four stages of algorithm. An Optimal Buffer Selection table is created at a first stage (FIG. 1), such as during initialization. The second stage takes a routing tree and creates an optimal list of buffers to be inserted into it (FIG. 4). Thus this stage accepts the routing tree as an input and provides the optimal list of buffers as an output. The third stage (FIG. 3) attempts to insert these buffers into segments in the routing tree and, if the transformation improves design parameters, accepts it. An optional fourth stage clears the Optimal Buffer Selection table from the memory.

Although the present invention has been described with reference to preferred embodiments, workers skilled in the art will recognize that changes may be made in form and detail without departing from the spirit and scope of the invention.

What is claimed is:

1. A process of inserting buffers into an integrated circuit chip design having an initial circuit performance based on initial circuit parameters, comprising:
   a) providing a table having dimensions including height, input capacitance, output capacitance and ramptime and which identifies buffer types based on a plurality of circuit parameters associated with the dimensions;
   b) defining a routing tree comprising root, internal and leaf vertices arranged so that each internal and leaf vertex has one parent vertex and each root and internal vertex has at least one child vertex, the parent and child vertices defining respective tree segments, and each internal vertex has an associated set of initial circuit parameters of the chip;
   c) for each internal vertex, comparing the initial circuit parameters associated with the internal vertex to the circuit parameters associated with buffers identified in the table to identify whether to insert a buffer identified in the table to the respective internal vertex; and
   d) inserting an optimal buffer identified in the table to a segment associated with a selected internal vertex based at least in part on the comparison results.

2. The process of claim 1, wherein step d comprises steps of, for each internal vertex associated with a segment identified in step c for insertion of a buffer
   d1) selecting an optimal buffer for insertion to the respective segment,
   d2) recomputing circuit parameters of the integrated circuit based on insertion of the selected buffer, and
   d3) inserting the selected buffer to the segment if the recomputed circuit parameters represent an improvement of circuit performance over the initial circuit performance.

3. The process of claim 1, wherein the circuit parameters comprise input capacitance, output capacitance, buffer height and ramptime.

4. The process of claim 1, wherein step c comprises steps of:
   c1) selecting an internal vertex,
   c2) comparing the initial circuit parameters associated with selected internal vertex to the circuit parameters associated with buffers identified in the table to identify whether to insert a buffer identified in the table to a segment associated with the selected internal vertex,
   c3) if step c2 a buffer is identified to be inserted to the segment, selecting an optimal insertable buffer based on the initial circuit parameters, and
   c4) if a delay parameter of the chip design is improved by the selected buffer, marking the selected internal vertex.

5. The process of claim 4, wherein step c4 is performed by marking the segment extending to the parent of the selected internal vertex with a first mark, and step c further comprises:
   c5) marking each segment connected to the selected internal vertex and extending to a child of the selected vertex with a second mark, and
   c6) iteratively repeating step c for each internal vertex from the root toward the leaf vertices, skipping internal vertices of segments with the second mark.

6. The process of claim 4, wherein step c is performed iteratively from the root vertex toward the leaf vertices, skipping internal vertices that are children of marked vertices.

7. The process of claim 4, wherein step d further comprises:
   d1) recomputing circuit parameters of the integrated circuit based on insertion of the optimal buffer for each marked vertex, and
   d2) inserting the selected buffer to a segment associated with the marked vertex if the recomputed circuit parameters represent an improvement of circuit performance over the initial circuit performance.

8. The process of claim 1, wherein step a comprises steps of:
   a1) identifying a plurality of intervals of buffer output capacitance ranges for buffers having a selected height and selected input pin capacitance,
   a2) identifying each buffer in each output capacitance interval having the selected height and input pin capacitance,
   a3) defining a plurality of buffer ramptime intervals of a range of buffer ramptimes represented by the buffers identified in step a2,
   a4) for each buffer ramptime interval identified in step a3 identifying an optimal buffer type based on the buffers identified in step a2, and
   a5) repeating steps a1-a4 for all buffer heights and all input pin capacitances for each buffer output capacitance interval.

9. The process of claim 8, further comprising, before step a1, steps of:
   selecting minimum and maximum buffer heights and a minimum buffer input pin capacitance for a buffer, and
   creating an array of input pin capacitances for buffers with heights between the minimum and maximum buffer heights.

10. A process of creating a table of optimal buffer types useful for designing integrated circuit chips containing buffers, comprising:
    a) creating an array having dimensions including height, input capacitance, output capacitance and ramptime;
    b) identifying a plurality of intervals of buffer output capacitance ranges for buffers having a selected height and selected input pin capacitance,
    c) identifying each buffer in each output capacitance interval having the selected height and input pin capacitance,
    d) defining a plurality of buffer ramptime intervals of a range of buffer ramptimes represented by the buffers identified in step c,
    e) for each buffer ramptime interval identified in step d identifying an optimal buffer type based on the buffers identified in step c and inserting the optimal buffer type into the table at a position along the dimensions that is representative of the selected height, the selected input capacitance, the respective output capacitance interval and the respective ramptime interval, and
    f) repeating steps b-e for all buffer heights and all input pin capacitances for each buffer output capacitance interval.

11. The process of claim 10 wherein step a comprises:
    selecting minimum and maximum buffer heights and a minimum buffer input pin capacitance for a buffer, and
    creating an array of input pin capacitances for buffers with heights between the minimum and maximum buffer heights.

12. A computer useable medium having a computer readable program embodied therein for controlling a computer containing a computer-readable file that defines an integrated circuit chip having an initial circuit performance based on initial circuit parameters, the computer further containing a computer-readable table identifying buffer types based on a plurality of circuit parameters, the computer readable program operating the computer to insert one or more buffers into the computer-readable file, the computer readable program comprising:

computer readable program code, which accesses the table along a plurality of dimensions including height, input capacitance, output capacitance and ramptime;

first computer readable program code for causing the computer to define a routing tree comprising root, internal and leaf vertices arranged so that each internal and leaf vertex has one parent vertex and each root and internal vertex has at least one child vertex, the parent and child vertices defining respective tree segments, and each internal vertex has an associated set of initial circuit parameters of the chip;

second computer readable program code for causing the computer to compare the initial circuit parameters associated with an internal vertex to the circuit parameters associated with buffers identified in the table to identify whether to insert a buffer identified in the table inserted to the respective internal vertex; and third computer readable program code for causing the computer to insert an optimal buffer identified in the table to a segment associated with a selected internal vertex based at least in part on the comparison results.

13. The computer useable medium of claim 12, wherein the third computer readable program code further comprises:

computer readable program code for causing the computer to select an optimal buffer for insertion to a segment associated with a respective internal vertex identified for insertion of a buffer computer readable program code for causing the computer to recompute circuit parameters of the integrated circuit based on insertion of the selected buffer, and computer readable program code for causing the computer to insert the selected buffer to the segment if the recomputed circuit parameters represent an improvement of circuit performance over the initial circuit performance.

14. The computer useable medium of claim 12, wherein the circuit parameters comprise input capacitance, output capacitance, buffer height and ramptime.

15. The computer useable medium of claim 12, wherein the second computer readable program code further comprises:

computer readable program code for causing the computer to select an internal vertex, computer readable program code for causing the computer to compare the initial circuit parameters associated with selected internal vertex to the circuit parameters associated with buffers identified in the table to identify whether to insert a buffer identified in the table to a segment associated with the selected internal vertex, computer readable program code responsive to an identification of whether to insert a buffer be inserted to the segment for causing the computer to select an optimal insertable buffer based on the initial circuit parameters, and computer readable program code responsive to an improvement of a delay parameter of the chip design by the selected buffer for causing the computer to mark the selected internal vertex.

16. The computer useable medium of claim 15, wherein the computer readable program code that causes the computer to mark an internal vertex causes the computer to mark the segment extending to the parent of the selected internal vertex with a first mark, and the second computer readable program code further comprises:

computer readable program code for causing the computer to mark each segment connected to the selected internal vertex and extending to a child to the selected vertex with a second mark, and computer readable program code for causing the computer to iteratively repeat execution of the second computer readable program code for each internal vertex from the root toward the leaf vertices, skipping internal vertices of segments with the second mark.

17. The computer useable medium of claim 15, wherein the second computer readable program code is iteratively executed by the computer on vertices from the root vertex toward the leaf vertices, skipping internal vertices that are children of marked vertices.

18. The computer useable medium of claim 15, wherein the third computer readable program code further comprises:

computer readable program code for causing the computer to recompute circuit parameters of the integrated circuit based on insertion of the optimal buffer for each marked vertex, and computer readable program code for causing the computer to insert the selected buffer to a segment associated with the marked vertex if the recomputed circuit parameters represent an improvement of circuit performance over the initial circuit performance.

19. The computer useable medium of claim 12, further including fourth computer readable program code for causing the computer to create the computer-readable table identifying buffers based on the plurality of circuit parameters, the fourth computer readable program code comprising:

computer readable program code for causing the computer to identify a plurality of intervals of buffer output capacitance ranges for buffers having a selected height and selected input pin capacitance, computer readable program code for causing the computer to identify each buffer in each output capacitance interval having the selected height and input pin capacitance, computer readable program code for causing the computer to define a plurality of buffer ramptime intervals of a range of buffer ramptimes represented by the identified buffers, computer readable program code for causing the computer to identify an optimal buffer type and insert the optimal buffer type into the table for each ramptime interval based on the identified buffers, and computer readable program code for causing the computer to execute the fourth computer readable program code for all buffer heights and all input pin capacitances for each buffer output capacitance interval.

20. The computer useable medium of claim 19, further comprising:

computer readable program code for causing the computer to select minimum and maximum buffer heights and a minimum buffer input pin capacitance for a buffer, and computer readable program code for causing the computer to create an array of input pin capacitances for buffers with heights between the minimum and maximum buffer heights.

* * * * *